United States Patent [19]
Nakata et al.

[11] Patent Number: 5,583,750
[45] Date of Patent: Dec. 10, 1996

[54] ELECTRONIC DEVICE

[75] Inventors: Kunihiro Nakata; Seiichi Kawashima, both of Hadano; Fumio Kishida, Isehara, all of Japan

[73] Assignees: Hitachi, Ltd.; Hitachi Microcomputer System, Ltd., both of Tokyo, Japan

[21] Appl. No.: 544,640

[22] Filed: Oct. 18, 1995

[30]  Foreign Application Priority Data

Oct. 27, 1994  [JP]  Japan .................................. 6-287562

[51] Int. Cl.⁶ ..................................... H05K 9/00
[52] U.S. Cl. .......................... 361/816; 361/796; 361/818; 174/35 R
[58] Field of Search ..................... 361/752, 753, 361/785, 796, 800, 816, 818; 174/35 R, 35 C, 35 GC, 85 TC; 257/659, 666; 439/108, 109, 607, 608, 609

[56]  References Cited

U.S. PATENT DOCUMENTS

| | | | |
|---|---|---|---|
| 5,343,361 | 8/1994 | Rudy, Jr. et al. | 361/710 |
| 5,353,202 | 10/1994 | Ansell et al. | |
| 5,388,030 | 2/1995 | Gasser et al. | 361/818 |

FOREIGN PATENT DOCUMENTS

| | | |
|---|---|---|
| 2-122493 | 10/1990 | Japan . |
| 5-3061 | 1/1993 | Japan . |
| 5-73171 | 3/1993 | Japan . |
| 6-232578 | 8/1994 | Japan . |

*Primary Examiner*—Leo P. Picard
*Assistant Examiner*—Y. Whang
*Attorney, Agent, or Firm*—Fay, Sharpe, Beall, Fagan, Minnich & McKee

[57]  ABSTRACT

In an electronic device comprising a first substrate having at least one first electronic circuit element thereon, a second substrate having at least one second electronic circuit element thereon, a substrate connector through which the first and second electronic circuit elements are connected electrically to each other, and an electrically grounded chassis receiving the first and second substrates, the first substrate has thereon a first electromagnetic shielding plate including an electrically conductive material, the second substrate has thereon a second electromagnetic shielding plate including the electrically conductive material, the first and second electromagnetic shielding plates are electrically connected to the chassis, and a wire length between a wire length limited electronic circuit element on the first substrate and another of the electronic circuit elements on the second substrate is limited for ensuring a high speed responsive operation therebetween.

20 Claims, 2 Drawing Sheets

ELECTRONIC DEVICE

BACKGROUND OF THE INVENTION AND RELATED ART STATEMENT

The present invention relates to an electronic device including a plurality of substrates and electronic circuit elements thereon.

JP-A-5-73171 discloses an electronic device in which a substrate has an electrically grounded grid thereon, and an interface connector for transmitting signals therethrough between the substrate and the outside of the electronic device is surrounded by a metal strip, so that the electrically grounded grid and the metal strip cooperate with each other to form an electromagnetic shield.

JP-A-6-232578 discloses another electronic device in which an interface connector for transmitting signals therethrough between a substrate and the outside of the electronic device is surrounded by a metal plate, the metal plate is fixed to the substrate, and a metal chassis receiving the substrate therein and the metal plate form an electromagnetic shield.

JP-U-2-122493 discloses a chassis for electronic device with an electromagnetic shield. JP-A-5-3061 discloses another interface connector surrounded by an electromagnetic shield.

OBJECT AND SUMMARY OF THE INVENTION

An object of the invention is to provide an electronic device including a plurality of substrates and electronic circuit elements thereon, preferable for reinforcing an electromagnetic shield, for easy exchange of the substrates, and/or for high speed responsive operations of the electronic circuit elements between the substrates.

In an electronic device comprising a first substrate having at least one first electronic circuit element thereon, a second substrate having at least one second electronic circuit element thereon, a substrate connector through which the first and second electronic circuit elements are connected electrically to each other, and an electrically grounded chassis receiving the first and second substrates, according to the present invention the first substrate has thereon a first electromagnetic shielding plate including an electrically conductive material, the second substrate has thereon a second electromagnetic shielding plate including the electrically conductive material, and the first and second electromagnetic shielding plates are electrically connected to the chassis, so that the first and second electronic circuit elements is surrounded by an electrically grounded combination of the chassis and the first and second electronic circuit elements.

In the substrate connector having a first connector portion electrically connected to the first electronic circuit element and mounted on the first substrate, and a second connector portion electrically connected to the second electronic circuit element and mounted on the second substrate so that the first and second connector portions contact with each other to form an electrical communication therebetween, a contacting (frictional and/or compressing) force in a direction between the first and second connector portions may press at least partially the first and second electromagnetic shielding plates in the direction against each other, so that the contact between the first and second electromagnetic shielding plates is reinforced by the frictional and/or compressing force and an insertion or assembly between the first and second connector portions is easily performed by utilizing an elasticity formed between the first and second electromagnetic shielding plates.

The first electromagnetic shielding plate and an interface connector through which an electric signal is input into at least one of the first and second electronic circuit elements from outside of the electronic device and output from the at least one of the first and second electronic circuit elements to the outside of the electronic device may extend through the second electromagnetic shielding plate, so that the interface connector is covered by both the first electromagnetic shielding plate and the second electromagnetic shielding plate. The interface connector may extend through the first and second electromagnetic shielding plates, so that an electromagnetic induction of the interface connector is prevented by a reinforced electromagnetic shield of a laminated combination of the first and second electromagnetic shielding plates. The first electromagnetic shielding plate may extend at least partially in an inside of the second electromagnetic shielding plate so that the first electronic circuit element is electromagneticaly isolated from an outside of the second electromagnetic shielding plate by a laminated combination of the first and second electromagnetic shielding plates.

A width of the first electromagnetic shielding plate may be smaller than that of the second electromagnetic shielding plate in a direction substantially parallel to a substrate thickness direction so that a combination of the first electromagnetic shielding plate and the first substrate is received within the width of the second electromagnetic shielding plate to be electromagnetically isolated from an outside of the electronic device by the second electromagnetic shielding plate. The first electromagnetic shielding plate may contact with the second electromagnetic shielding plate within the width of the second electromagnetic shielding plate in the direction substantially parallel to the substrate thickness direction so that the combination of the first electromagnetic shielding plate and the first substrate is received within the width of the second electromagnetic shielding plate, and a continuous electromagnetic shield is prevented by the first and/or second electromagnetic shielding plate from being deteriorated or interrupted at a contact region between the first and second electromagnetic shielding plates.

In an electronic device comprising a first substrate having a set of electronic circuit elements thereon, a second substrate having another set of electronic circuit elements thereon, and a substrate connector through which the sets of electronic circuit elements on the first and second substrates are connected electrically to each other, according to the present invention, the set of electronic circuit elements on the first substrate includes a wire length limited electronic circuit element and a wire length non-limited electronic circuit element, the wire length limited electronic circuit element has a wire electrically connecting the wire length limited electronic circuit element to at least one of the electronic circuit elements on the second substrate through the substrate connector, and a length of the wire between the wire length limited electronic circuit element and the at least one of the electronic circuit elements on the second substrate is limited for ensuring a high speed operation of at least one of the wire length limited electronic circuit element and the at least one of the electronic circuit elements on the second substrate.

The wire length limited electronic circuit element may be arranged between the wire length non-limited electronic circuit element and the substrate connector on the first substrate so that the length of the wire between the wire length limited electronic circuit element on the first substrate and the at least one of the electronic circuit elements on the second substrate is securely smaller than the length of the wire between the wire length non-limited electronic circuit element on the first substrate and the at least one of the electronic circuit elements on the second substrate.

DETAILED DESCRIPTION OF PREFERRED EMBODIMENTS

Figure 1:
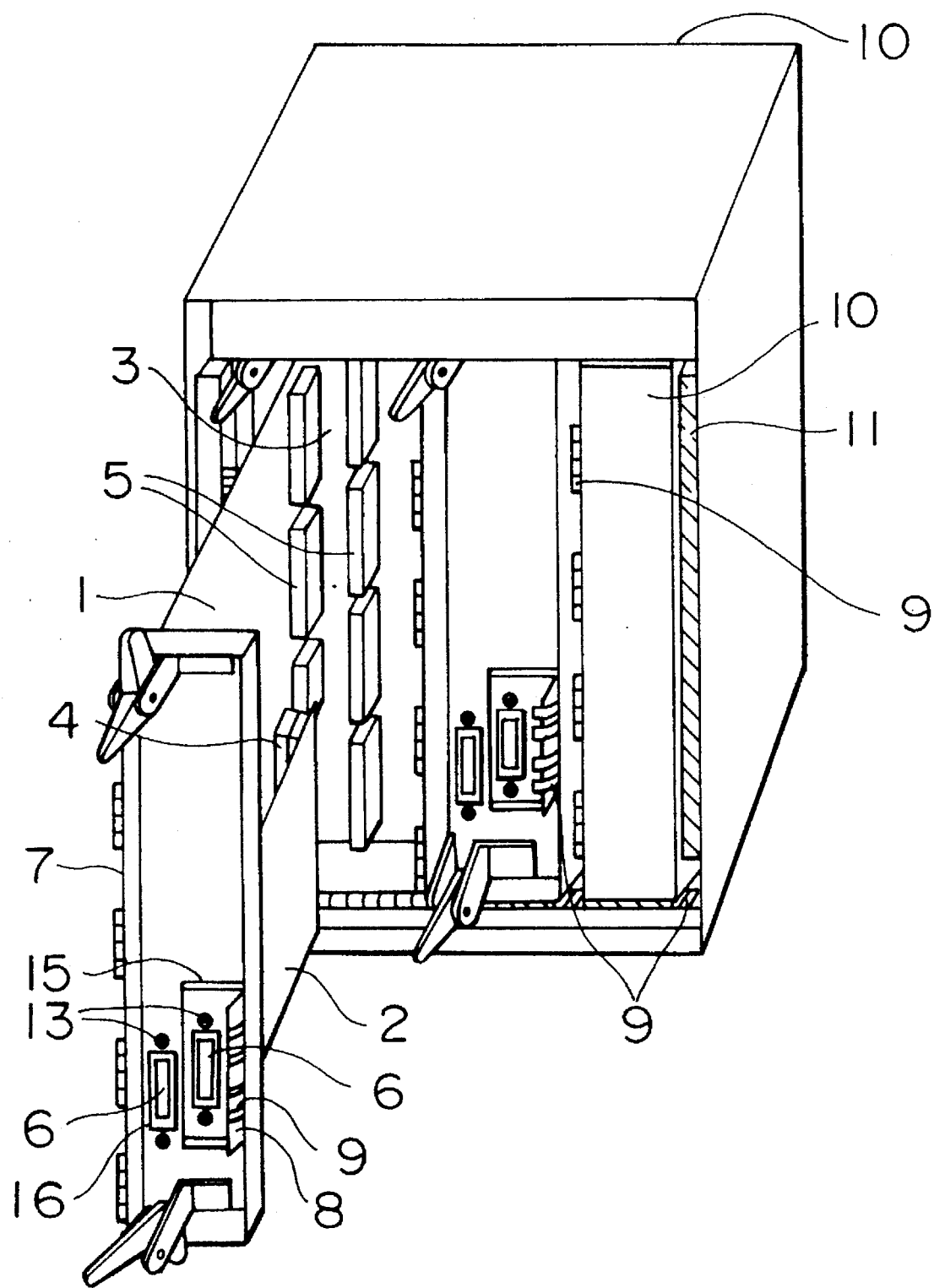
FIG. 1 is an oblique projection view showing an electronic device according to the present invention.
Figure 2:
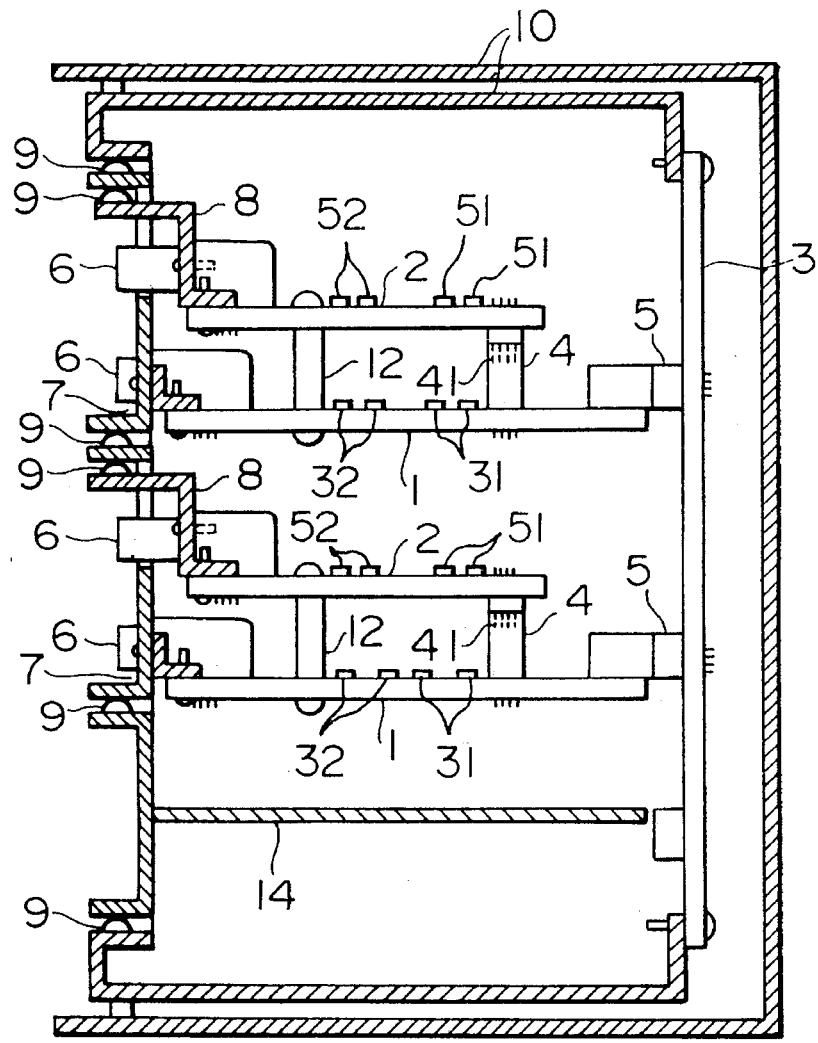
FIG. 2 is a partially cross-sectional view showing an inner structure of the electronic device according to the present invention.
Figure 3:
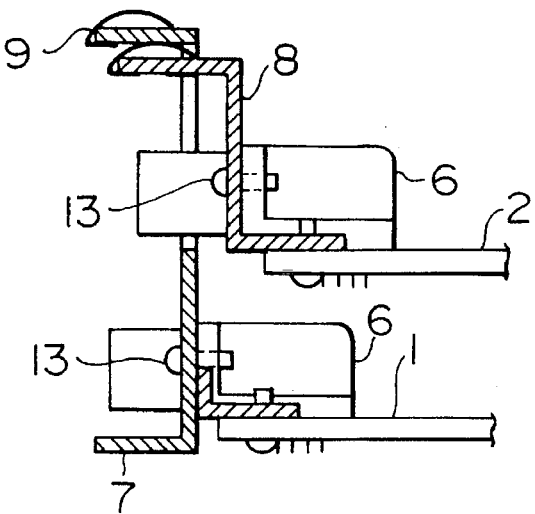
FIG. 3 is an enlarged cross-sectional view of a part of the inner structure shown in FIG. 2.

In an electrically grounded chassis 10, central processing unit (CPU) substrates 1 with wire length limited electronic circuit elements (for example, components of a reduced instruction set computer) 31 and wire length non-limited electronic circuit elements (for example, memory LSI) 32 thereon are juxtaposed with each other and connected to each other by CPU substrate connectors 5 and a laminated wire substrate 3 in which wires for electrical communication between the CPU substrates 1 are stacked up in a CPU substrate connector thickness direction. Interface unit substrates 2 with wire length limited electronic circuit elements (for example, components of the reduced instruction set computer) 51 and wire length non-limited electronic circuit elements (for example, memory LSI) 52 are mounted respectively on the CPU substrates 1, and each of substrate connectors 4 a first part of which is mounted on the CPU substrate 1 and a second part of which is mounted on the interface unit substrate 2 for electrical communication between the electronic circuit elements 31 and 32 and the electronic circuit elements 51 and 52 has an inserting portion 41 which extends in a substrate thickness direction and on which the first and second parts of the substrate connector 4 engage with each other for electrical communication between the CPU substrates 1 and the interface unit substrates 2. By exchanging at least one of the interface unit substrates 2, an electronic device composed of the CPU substrates 1 and the interface unit substrates 2 can perform various different functions. The wire length limited electronic circuit elements 31 and 51 are arranged relatively closer to the substrate connectors 4 in comparison with the wire length non-limited electronic circuit elements 32 and 52. The electronic circuit elements 31 and 32 on the CPU substrates 1 and the electronic circuit elements 51 and 52 on the interface unit substrates 2 have electrical communications to an outside of the electronic device through interface connectors 6 mounted on the CPU substrates 1 and the interface unit substrates 2.

The interface connectors 6 mounted on the CPU substrates 1 are at least partially surrounded by electromagnetic shield electrically conductive plates 7 fixed to the CPU substrates 1, and the interface connectors 6 mounted on the interface unit substrates 2 are at least partially surrounded by electromagnetic shield electrically conductive plates 8 fixed to the interface unit substrates 2. The interface connectors 6 mounted on the interface unit substrates 2 extend through openings 15 of the electromagnetic shield plates 7, and the interface connectors 6 mounted on the CPU substrates 1 extend through openings 16 of the electromagnetic shield plates 7.

The interface connectors 6 mounted on the CPU substrates i are fixed to to the electromagnetic shield plates 7 by screws 13 to be electrically grounded therethrough, and the interface connectors 6 mounted on the interface unit substrates 2 are fixed to to the electromagnetic shield plates 8 by the screws 13 to be electrically grounded therethrough. The electromagnetic shield plates 8 are connected to the electromagnetic shield plates 7 by electrically conductive elastic members 9 to be electrically grounded therethrough. An elastic force by the elastic members 9 press the first and second parts of the substrate connectors 4 against each other to maintain engagement therebetween.

An inner volume of the chassis 10 made of an electrically conductive material and receiving the CPU substrates 1, the interface unit substrates 2 and dummy substrates 14 is electromagnetically shielded or isolated from the outside thereof by the electromagnetic shield plates 7, the electromagnetic shield plates 8, the elastic members 9 and electrically conductive gaskets 11.

What is claimed is:

1. An electronic device comprising a first substrate having at least one first electronic circuit element thereon, a second substrate having at least one second electronic circuit element thereon, a substrate connector through which the first and second electronic circuit elements are connected electrically to each other, and an electrically grounded chassis receiving the first and second substrates, wherein the first substrate has thereon a first electromagnetic shielding plate including an electrically conductive material, the second substrate has thereon a second electromagnetic shielding plate including the electrically conductive material, and the first and second electromagnetic shielding plates are electrically connected to the chassis.

2. An electronic device according to claim 1, wherein the substrate connector has a first connector portion electrically connected to the first electronic circuit element and mounted on the first substrate, and a second connector portion electrically connected to the second electronic circuit element and mounted on the second substrate, the first and second connector portions contact with each other to form an electrical communication therebetween, and a contacting force between the first and second connector portions presses at least partially the first and second electromagnetic shielding plates against each other.

3. An electronic device according to claim 1, wherein the first substrate is supported by the second substrate, and the first electromagnetic shielding plate is connected to the second substrate through the first substrate and contacts with the second electromagnetic shielding plate, so that the first and second substrates and the first and second electromagnetic shielding plates form an integral unit.

4. An electronic device according to claim 1, wherein the electronic device further comprises an interface connector through which an electric signal is input into at least one of the first and second electronic circuit elements from outside of the electronic device and output from the at least one of the first and second electronic circuit elements to the outside of the electronic device, and the first electromagnetic shielding plate and the interface connector extend through the second electromagnetic shielding plate.

5. An electronic device according to claim 1, wherein the electronic device further comprises an interface connector through which an electric signal is input into at least one of the first and second electronic circuit elements from outside of the electronic device and output from the at least one of the first and second electronic circuit elements to the outside of the electronic device, and the interface connector extends through the first and second electromagnetic shielding plates.

6. An electronic device according to claim 1, wherein a part of the first substrate is supported on the second substrate by the substrate connector.

7. An electronic device according to claim 1, wherein the first electromagnetic shielding plate extends at least partially to an inside of the second electromagnetic shielding plate so that the first electronic circuit element is electromagneticaly isolated from an outside of the second electromagnetic shielding plate by a laminated combination of the first and second electromagnetic shielding plates.

8. An electronic device according to claim 7, wherein a laminating direction of the laminated combination of the first and second electromagnetic shielding plates is substantially parallel to a substrate longitudinal direction.

9. An electronic device according to claim 1, wherein a width of the first electromagnetic shielding plate is smaller than that of the second electromagnetic shielding plate in a direction substantially parallel to a substrate thickness direction so that a combination of the first electromagnetic shielding plate and the first substrate is received within the width of the second electromagnetic shielding plate.

10. An electronic device according to claim 1, wherein the first electromagnetic shielding plate contacts with the second electromagnetic shielding plate within a width of the second electromagnetic shielding plate in a direction substantially parallel to a substrate thickness direction so that a combination of the first electromagnetic shielding plate and the first substrate is received within the width of the second electromagnetic shielding plate.

11. An electronic device comprising a first substrate having a set of electronic circuit elements thereon, a second substrate having another set of electronic circuit elements thereon, and a substrate connector through which the sets of electronic circuit elements on the first and second substrates are connected electrically to each other, wherein the set of electronic circuit elements on the first substrate includes a wire length limited electronic circuit element and a wire length non-limited electronic circuit element, the wire length limited electronic circuit element has a wire electrically connecting the wire length limited electronic circuit element to at least one of the electronic circuit elements on the second substrate through the substrate connector, and a length of the wire between the wire length limited electronic circuit element and the at least one of the electronic circuit elements on the second substrate is limited for ensuring a high speed operation of at least one of the wire length limited electronic circuit element and the at least one of the electronic circuit elements on the second substrate.

12. An electronic device according to claim 11, wherein the wire length limited electronic circuit element is arranged between the wire length non-limited electronic circuit element and the substrate connector on the first substrate.

13. An electronic device according to claim 11, wherein the wire length limited electronic circuit element is a component of a reduced instruction set computer.

14. An electronic device according to claim 11, wherein the at least one of the electronic circuit elements on the second substrate connected electrically to the wire length limited electronic circuit element by the wire through the substrate connector is a component of a reduced instruction set computer.

15. An electronic device according to claim 11, further comprising an interface connector through which an electric signal is input into the set of electronic circuit elements on the first substrate from outside of the electronic device and output from the set of the electronic circuit elements on the first substrate to the outside of the electronic device, wherein the wire length non-limited electronic circuit element is arranged between the interface connector and the wire length limited electronic circuit element.

16. An electronic device according to claim 11, further comprising a third substrate having another set of electronic circuit elements thereon, and another substrate connector through which the electronic circuit elements on at least one of the first and second substrates are connected electrically to the electronic circuit elements on the third substrate, wherein the substrate connector is arranged between the another substrate connector and the electronic circuit elements on the at least one of the first and second substrates connected electrically to the electronic circuit elements on the third substrate.

17. An electronic device according to claim 11, further comprising a third substrate having another set of electronic circuit elements thereon, and a laminated wire substrate including wires stacked up in a substrate thickness direction of the laminated wire substrate, wherein the electronic circuit elements on at least one of the first and second substrates are connected electrically to the electronic circuit elements on the third substrate through the wires of the laminated wire substrate.

18. An electronic device according to claim 11, further comprising an electromagnetic shielding plate, wherein the wire length non-limited electronic circuit element is arranged between the electromagnetic shielding plate and the wire length limited electronic circuit element.

19. An electronic device according to claim 11, further comprising an interface connector through which an electric signal is input into the electronic circuit elements on at least one of the first and second substrates from outside of the electronic device and output from the electronic circuit elements on the at least one of the first and second substrates to the outside of the electronic device, wherein the wire length non-limited electronic circuit element is arranged between the wire length limited electronic circuit element and the interface connector.

20. An electronic device according to claim 11, further comprising an interface connector through which an electric signal is input into the electronic circuit elements on at least one of the first and second substrates from outside of the electronic device and output from the electronic circuit elements on the at least one of the first and second substrates to the outside of the electronic device, wherein the wire length non-limited electronic circuit element and the wire length limited electronic circuit element are arranged between the interface connector and the substrate connector.

* * * * *